(12) United States Patent
Chen et al.

(10) Patent No.: US 10,376,055 B2
(45) Date of Patent: Aug. 13, 2019

(54) SLIDE RAIL RACK SYSTEM AND CARRIED OBJECT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/960,561

(22) Filed: Apr. 24, 2018

(65) Prior Publication Data

US 2019/0142158 A1     May 16, 2019

(30) Foreign Application Priority Data

Nov. 13, 2017   (TW) .............................. 106139380 A

(51) Int. Cl.
  *A47B 88/43*   (2017.01)
  *A47B 88/477*  (2017.01)
  *H05K 7/18*    (2006.01)

(52) U.S. Cl.
  CPC ............ *A47B 88/477* (2017.01); *A47B 88/43* (2017.01); *H05K 7/183* (2013.01)

(58) Field of Classification Search
  CPC .... H05K 7/183; H05K 7/1409; H05K 7/1411; H05K 7/1421; H05K 7/1489; H05K 7/18; A47B 88/427; A47B 88/403; A47B 96/06; A47B 88/477; A47B 88/43; A47B 88/417; G06F 1/187; G06F 1/183; G11B 33/128; Y10T 304/59; Y10T 304/591; Y10T 304/595; Y10T 304/599

(Continued)

(56) References Cited

U.S. PATENT DOCUMENTS 5,262,923 A * 11/1993 Batta ....................... G06F 1/184
                                                  312/333
5,734,557 A *  3/1998 McAnally ............ G11B 33/124
                                                361/679.58

(Continued)

FOREIGN PATENT DOCUMENTS

EP        3157313      *  4/2017

*Primary Examiner* — Janet M Wilkens
(74) *Attorney, Agent, or Firm* — Winston Hsu

(57) ABSTRACT

A carried object is applied to a rack system. The rack system includes a rack. The rack includes a plurality of posts. The carried object includes a first side wall and a second side wall. Each of the first side wall and the second side wall has a front end portion and a rear end portion. Wherein, an engaging hole is arranged on at least one of the first side wall and the second side wall. A fastening member is arranged at one of the first side wall and the second side wall. The fastening member has a blocking portion extended out of the engaging hole. When the carried object is moved from a first position to a second position, position of a blocking section of the blocking portion of the fastening member is corresponding to one of the plurality of posts of the rack.

15 Claims, 7 Drawing Sheets

(58) Field of Classification Search
USPC ............ 312/334.7, 223.1, 334.4, 334.5, 333, 312/334.44, 334.46; 211/26, 189; 384/21, 22
See application file for complete search history.

(56) References Cited

U.S. PATENT DOCUMENTS

| | | | | |
|---|---|---|---|---|
| 6,360,900 B1 * | 3/2002 | Carbonneau | ............ | H05K 7/183 211/26 |
| 6,388,875 B1 * | 5/2002 | Chen | ........................ | G06F 1/184 312/223.1 |
| 6,398,041 B1 | 6/2002 | Abbott | | |
| 6,609,619 B2 | 8/2003 | Abbott | | |
| 6,980,439 B2 * | 12/2005 | Schultz | ................. | H01L 23/552 174/558 |
| 6,999,309 B2 * | 2/2006 | Hsu | ........................ | G06F 1/184 312/223.1 |
| 7,106,596 B1 * | 9/2006 | Reznikov | ................ | G06F 1/185 312/223.1 |
| 7,134,802 B2 * | 11/2006 | Doerr | ...................... | E05C 19/06 403/322.1 |
| 7,523,901 B2 * | 4/2009 | Wu | ...................... | G11B 33/128 211/162 |
| 7,661,553 B2 * | 2/2010 | Zeiron | ................. | A47K 10/427 221/305 |
| 7,810,653 B2 | 10/2010 | Schmidtke | | |
| 8,496,493 B2 * | 7/2013 | Lin | ........................ | G06F 1/187 439/345 |
| 9,681,574 B1 * | 6/2017 | Chen | .................... | H05K 7/1489 |
| 2009/0213540 A1 * | 8/2009 | Zhang | ..................... | G06F 1/183 361/679.58 |
| 2009/0255099 A1 * | 10/2009 | Zhang | ..................... | G06F 1/183 24/572.1 |
| 2011/0180316 A1 * | 7/2011 | Nakayama | ........... | H05K 7/1421 174/520 |
| 2015/0223364 A1 * | 8/2015 | Mundt | ................. | G11B 33/124 174/541 |
| 2015/0245709 A1 * | 9/2015 | Iwamoto | ............. | H05K 7/1489 211/175 |
| 2016/0132080 A1 * | 5/2016 | Shen | ...................... | G06F 1/187 361/679.33 |

\* cited by examiner

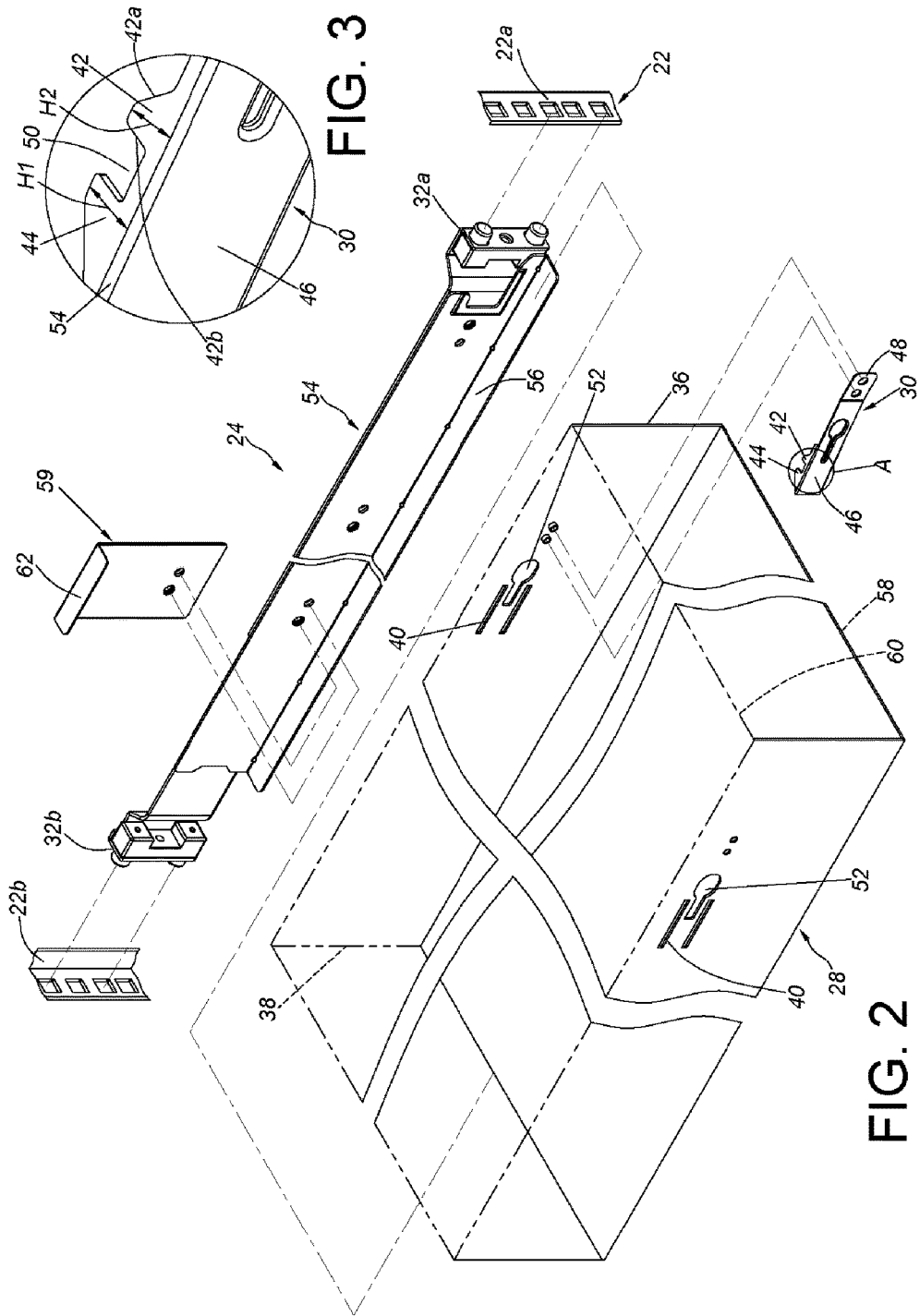

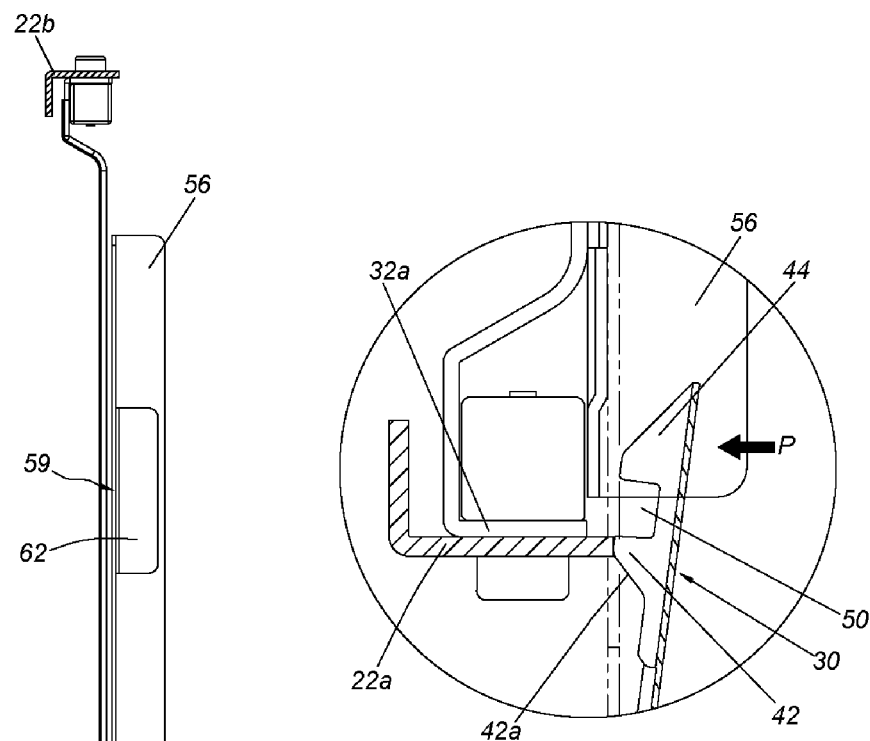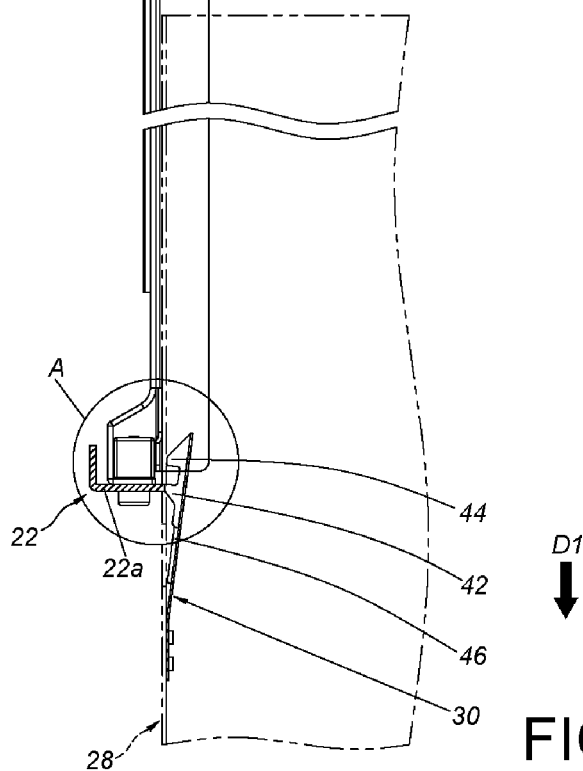

SLIDE RAIL RACK SYSTEM AND CARRIED OBJECT THEREOF

BACKGROUND OF THE INVENTION

1. Field of the Invention

The present invention relates to a rack system, and more particularly, to a slide rail rack system and a carried object thereof.

2. Description of the Prior Art

Generally, in a rack system, an electronic apparatus or a chassis is mounted on posts of a rack through a slide rail. US patent number U.S. Pat. No. 6,398,041 B1 discloses a fastening system, which comprises a chassis (11). When the chassis (11) is located inside a rack, the chassis (11) is able to be respectively engaged with a left front post (13L) and a right front post (13R) of the rack through two locks (30L, 30R) respectively arranged on left front end and right front end of the chassis (11).

However, for operation requirements, how to develop a chassis or an electronic apparatus, which is able to prevent the chassis or the electronic apparatus from being moved from a predetermined position when the chassis or the electronic apparatus is pulled out from inside of a rack to the predetermined position, has become an issue.

SUMMARY OF THE INVENTION

The present invention provides a rack system capable of preventing a carried object from being moved from a predetermined position.

According to an aspect of the present invention, a rack system includes a rack, a first slide rail assembly, a second slide rail assembly, a carried object and a fastening member. The rack includes a plurality of posts. The first slide rail assembly is mounted on a first side of the rack. The second slide rail assembly is mounted on a second side of the rack. The carried object is arranged between the first slide rail assembly and the second slide rail assembly. The carried object includes a first side wall and a second side wall. Each of the first side wall and the second side wall has a front end portion and a rear end portion. Wherein, an engaging hole is arranged on at least one of the first side wall and the second side wall. The fastening member is arranged on the carried object. The fastening member has a first blocking portion. Wherein, the first blocking portion extending out of the engaging hole on the carried object. Wherein, when the carried object is moved from a first position to a second position, a blocking section of the first blocking portion of the fastening member is located corresponding to one of the plurality of posts of the rack, in order to prevent the carried object from being moved from the second position toward the first position.

Preferably, the engaging hole on the carried object is located between the front end portion and the rear end portion, and the engaging hole is located far away from the front end portion.

Preferably, the fastening member further includes an elastic arm. An elastic force is applied to the first blocking portion through the elastic arm. The elastic arm has a fixing portion securely connected to the carried object.

Preferably, the first blocking portion of the fastening member has a guiding side. The guiding side has at least one of an inclined surface and an arc surface.

Preferably, the fastening member further includes a second blocking portion. The elastic force is applied on the second blocking portion through the elastic arm. A fastening portion is defined between the first blocking portion and the second blocking portion. The fastening portion is configured to be engaged with one of the plurality of posts of the rack.

Preferably, the carried object has an operation hole. The operation hole is located corresponding to the elastic arm of the fastening member.

Preferably, the first blocking portion and the second blocking portion extend from an arm side of the elastic arm. An extended length of the second blocking portion is greater than a length of the first blocking portion.

Preferably, the first slide rail assembly and the second slide rail assembly are mounted on the rack through two brackets, respectively.

Preferably, one of the first slide rail assembly and the second slide rail assembly includes an L-shaped supporting rail. The supporting rail is non-movable relative to the rack. The supporting rail is configured to support a bottom of the carried object.

Preferably, the rack system further includes an upper blocking member arranged on one of the first slide rail assembly and the second slide rail assembly, and the upper blocking member being configured to block a top of the carried object.

According to another aspect of the present invention, a carried object of a rack system includes a first side wall, a second side wall and a fastening member. The rack system includes a rack. The rack includes a plurality of posts. Each of the first side wall and the second side wall has a front end portion and a rear end portion. Wherein, an engaging hole is arranged on at least one of the first side wall and the second side wall. The fastening member is arranged at one of the first side wall and the second side wall. The fastening member has a first blocking portion. The first blocking portion extends out of the engaging hole. Wherein, when the carried object is moved from a first position to a second position, a blocking section of the first blocking portion of the fastening member is located corresponding to a front side of one of the plurality of posts of the rack.

According to another aspect of the present invention, a rack system includes a rack, a carried object and a fastening member. The rack includes a plurality of posts. The carried object is mounted on the plurality of posts through a pair of slide rail assemblies. The fastening member is arranged on the carried object. The fastening member has an elastic arm and a first blocking portion. Wherein, when the carried object is moved from a first position to a second position along a first direction, the first blocking portion contacts one of the plurality posts of the rack, such that the elastic arm is deflected by an angle and accumulates an elastic force, and the first blocking portion is able to pass over one of the plurality of the posts of the rack. Wherein, when the carried object is located in the second position, the first blocking portion is able to be obstructed on a front side of one of the plurality of posts in response to the elastic force released from the elastic arm, so as to prevent the carried object from being moved from the second position along a second direction opposite to the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the rack system according to the embodiment of the present invention.

FIG. 3 is an enlarged view of an area A shown in FIG. 2.

FIG. 7 is a diagram illustrating the carried object being further moved along the direction and the fastening member contacting with the post in a further situation according to the embodiment of the present invention.

FIG. 8 is an enlarged view of an area A shown in FIG. 7.

DETAILED DESCRIPTION

Figure 1:
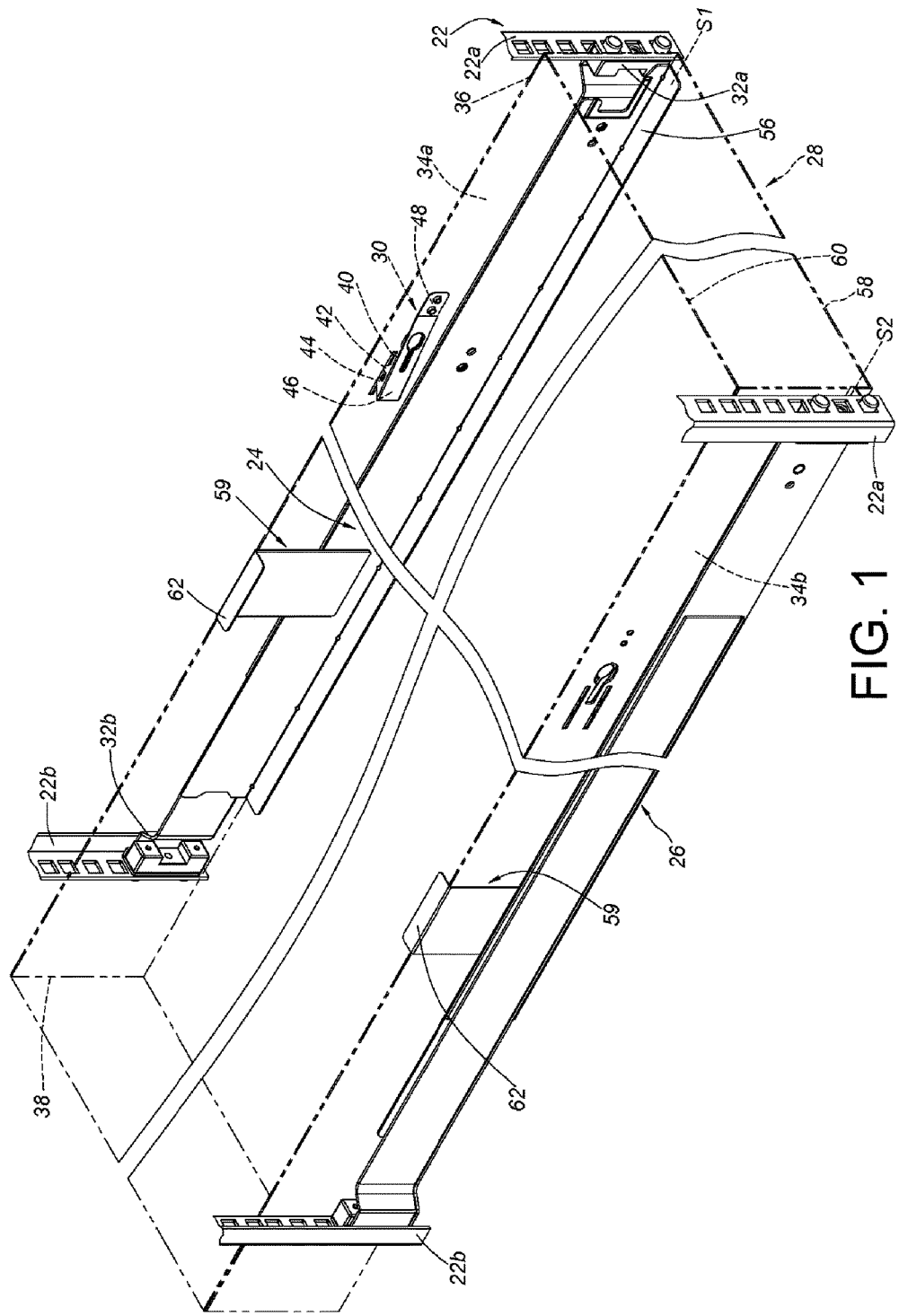
FIG. 1 is a schematic diagram illustrating a rack system according to an embodiment of the present invention.

As shown in FIG. 1 and FIG. 2, a rack system according to an embodiment of the present invention includes a rack 22, a first slide rail assembly 24, a second slide rail assembly 26, a carried object 28 and a fastening member 30.

The rack 22 includes a plurality of posts. Hereinafter, it is illustrative of an example that the rack 22 includes a pair of first posts 22a (i.e., a pair of front posts) and a pair of second posts 22b (i.e., a pair of rear posts), and the first posts 22a and the second posts 22b are separated from each other.

The first slide rail assembly 24 and the second slide rail assembly 26 are respectively mounted on a first side S1 and a second side S2 of the rack 22. The first slide rail assembly 24 and the second slide rail assembly 26 substantially have identical arrangements of structure. For simplification, only the first slide rail assembly 24 will be illustrated in the present embodiment. Specifically, two portions (such as a front portion and a rear portion) of the first slide rail assembly 24 are mounted on the first post 22a and the second post 22b of the rack 22 through two brackets 32a, 32b, but the present invention is not limited thereto.

The carried object 28 can be, for example, a chassis or an electronic apparatus, but the present invention is not limited thereto. The carried object 28 is arranged between the first slide rail assembly 24 and the second slide rail assembly 26. The carried object 28 includes a first side wall 34a and a second side wall 34b. Each of the first side wall 34a and the second side wall 34b has a front end portion 36 and a rear end portion 38, wherein an engaging hole 40 is arranged on at least one of the first side wall 34a and the second side wall 34b. Hereinafter, the engaging hole 40 being arranged on the first side wall 34a is illustrative of an example.

The fastening member 30 is arranged on one of the first side wall 34a and the second side wall 34b of the carried object 28. Hereinafter, the fastening member 30 being arranged on the first side wall 34a is illustrative of an example. Specifically, the fastening member 30 has a first blocking portion 42, wherein the first blocking portion 42 is extended from the engaging hole 40 on the carried object 28.

Preferably, the engaging hole 40 on the carried object 28 is located between the front end portion 36 and the rear end portion 38 of the first side wall 34a, and the engaging hole 40 is located far away from the front end portion 36.

Preferably, the fastening member 30 further includes a second blocking portion 44 and an elastic arm 46, wherein the elastic arm 46 has a fixing portion 48 securely connected to an inner wall of the first side wall 34a of the carried object 28, and the second blocking portion 44 and the first blocking portion 42 are located on the elastic arm 46 and far from the fixing portion 48. Preferably, the first blocking portion 42 and the second blocking portion 44 partially extend inside out from the engaging hole 40 on the carried object 28. Preferably, a fastening portion 50 is defined between the first blocking portion 42 and the second blocking portion 44 (referring to FIG. 3). The first blocking portion 42 of the fastening member 30 has a guiding side 42a and a blocking section 42b located opposite to the guiding side 42a, and the guiding side 42a is at least one of an inclined surface and an arc surface. Preferably, the first blocking portion 42 and the second blocking portion 44 extend from an arm side of the elastic arm 46, and the extended length H1 of the second blocking portion 44 is greater than the extended length H2 of the first blocking portion 42.

Preferably, an operation hole 52 is formed on the carried object 28. A position of the operation hole 52 is corresponding to a part of the elastic arm 46 of the fastening member 30.

Preferably, one of the first slide rail assembly 24 and the second slide rail assembly 26 includes an L-shaped supporting rail 54. The supporting rail 54 is mounted on the first post 22a and the second post 22b of the rack 22 through the two brackets 32a, 32b. Therefore, the supporting rail 54 is not movable relative to the rack 22. In other words, the supporting rail 54 is fixed, and the supporting rail 54 includes a horizon portion 56 configured to support a bottom 58 of the carried object 28.

Preferably, the rack system further includes an upper blocking member 59 arranged on one of the first slide rail assembly 24 and the second slide rail assembly 26. The upper blocking member 59 is configured to block a top 60 of the carried object 28.

Figure 4:
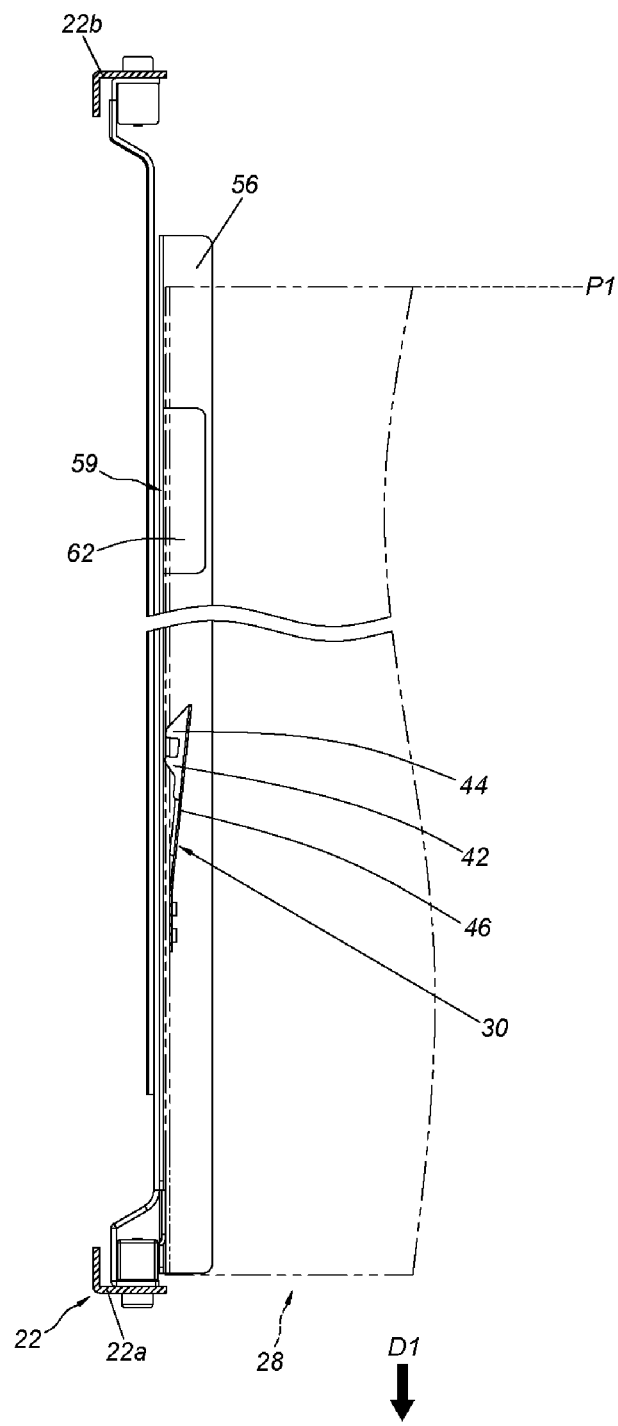
FIG. 4 is a diagram illustrating a carried object located in a first position in a rack according to the embodiment of the present invention.
Figure 6:
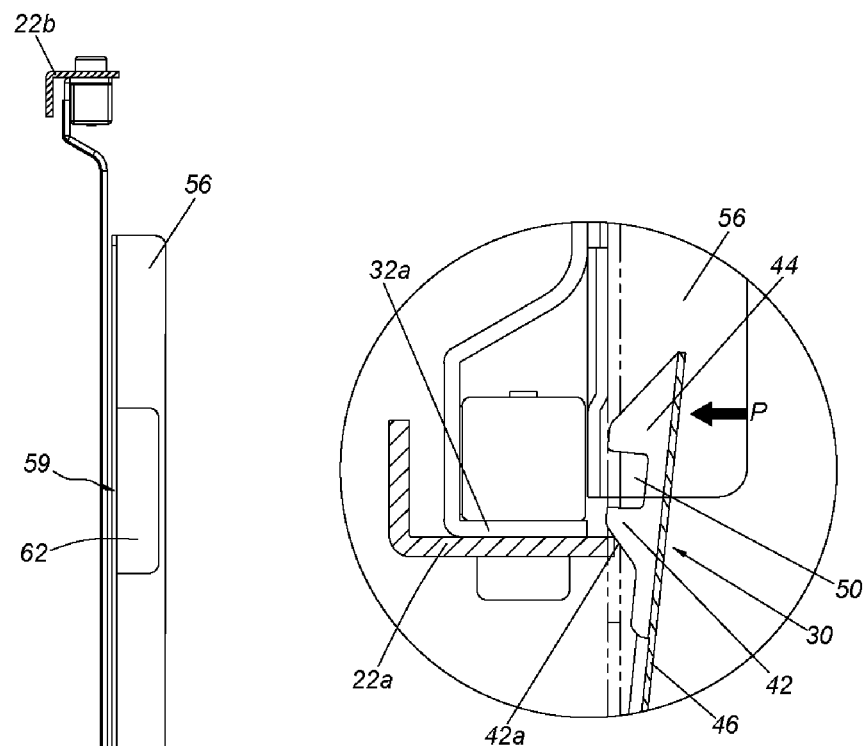
FIG. 6 is an enlarged view of an area A shown in FIG. 5.
Figure 5:
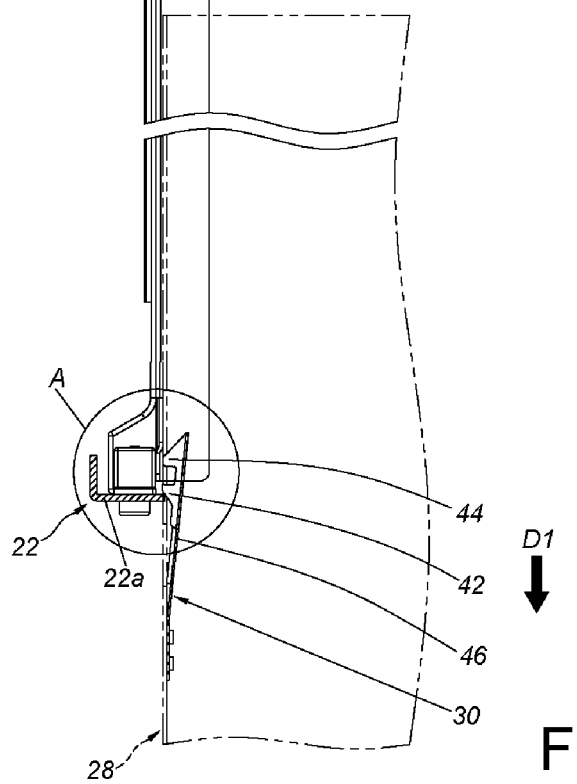
FIG. 5 is a diagram illustrating the carried object being moved from an interior of the rack along a direction and a fastening member contacts with a post of the rack according to the embodiment of the present invention.

As shown in FIG. 4, FIG. 5 and FIG. 6, when the carried object 28 is moved from the interior of the rack 22 from a first position P1 by a predetermined movement along a first direction D1, the fastening member 30 contacts the first post 22a of the rack 22 through the first blocking portion 42, such that the elastic arm 46 is deflected by an angle and gradually accumulates an elastic force P. Preferably, the fastening member 30 contacts the first post 22a of the rack 22 through the first guiding side 42a of the first blocking portion 42, so as to guide the fastening member 30 and to conduce to accumulation of the elastic force P by the elastic arm 46.

Figure 10:
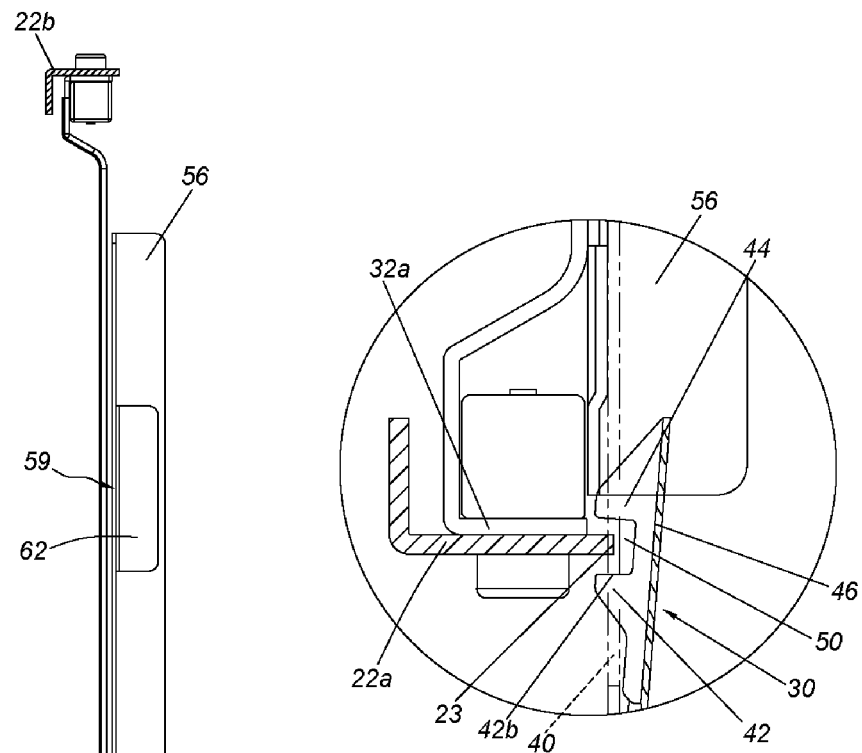
FIG. 10 is an enlarged view of an area A shown in FIG. 9.
Figure 9:
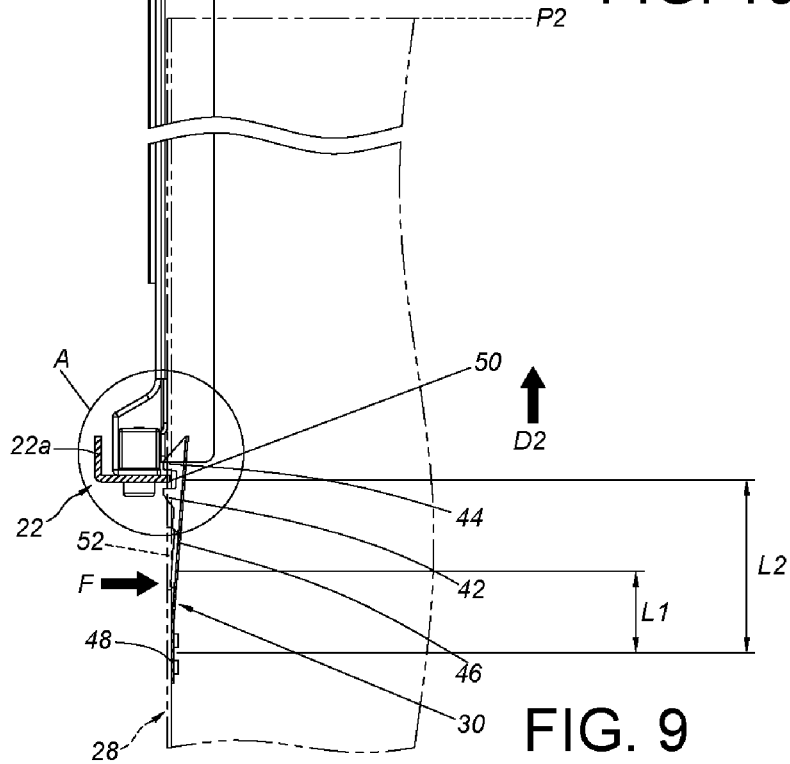
FIG. 9 is a diagram illustrating the carried object being moved to a second position along the direction and the fastening member being configured to be engaged with the post according to the embodiment of the present invention.

As shown in FIG. 7, FIG. 8, FIG. 9 and FIG. 10, when the carried object 28 is further moved along the first direction D1, the first blocking portion 42 of the fastening member 30 is able to pass over the first post 22a of the rack 22. Moreover, when the carried object 28 is located in a second position P2, the first blocking portion 42 and the second blocking portion 44 are able to be moved toward the first post 22a in response to the elastic force P released by the elastic arm 46 wherein the position of the blocking section 42b of the first blocking portion 42 of the fastening member 30 is corresponding to (or obstructed on) a front side of the first post 22a of the rack 22 (As shown in FIG. 9 and FIG. 10), so as to prevent the carried object 28 from being moved from the second position P2 along a second direction D2 opposite to the first direction D1. In other words, the aforesaid mechanism facilitates to prevent the carried object 28 from being moved from the second position P2 to the first position P1. Preferably, when the carried object 28 is located in the second position P2, the fastening portion 50 of the fastening member 30 is configured to be engaged with the first post 22a, e.g., the fastening portion 50 of the fastening member 30 is engaged with a post side 23 of the first post 22a, but the present invention is not limited thereto. It can be seen that when the fastening portion 50 of the fastening member 30 is engaged with the first post 22a, the aforesaid mechanism facilitates to prevent the carried object 28 from being moved from the second position P2 along the first direction D1 or the second direction D2. During the process of the movement of the carried object 28 from the position shown in FIG. 7 (or in FIG. 8) along the first direction D1, it is noticed that a moving velocity of the carried object 28 along the first direction D1 is faster than a threshold value (e.g., the moving velocity is faster than a velocity that the first blocking portion 42 and the second blocking portion 44 are moved toward the first post 22a in response to the elastic force P released by the elastic arm 46) may result in that the fastening portion 50 and the second blocking portion 44 of the fastening member 30 directly pass over the first post 22a. Accordingly, the fastening portion 50 of the fastening member 30 fails to be engaged with the first post 22a. The structure that the extended length H1 of the second blocking portion 44 is greater than the extended length H2 of the first blocking portion 42 of the present invention will enhance difficulty for the second blocking portion 44 of the fastening member 30 to pass over the first post 22a, which enables the fastening portion 50 of the fastening member 30 to successfully engage with the first post 22a under the aforesaid situation that the moving velocity of the carried object 28 along the first direction D1 is faster.

It is noticed that as shown in FIG. 9, a distance L1 between the operation hole 52 of the carried object 28 and the fixing portion 48 of the elastic arm 46 is smaller than a distance L2 between the fastening portion 50 of the elastic arm 46 and the fixing portion 48 of the elastic arm 46. As a result, when the carried object 28 is located in the second position P2, the operation hole 52 of the carried object 28 is able to be exceed the first post 22a to be exposed accordingly, such that a user is able to apply a force F to operate the elastic arm 46 through the operation hole 52, which allows the fastening portion 50 to be no longer engaged with the first post 22a. In other words, the carried object 28 is able to be moved from the second position P2 along the first direction D1 or the second direction D2.

Figure 11:
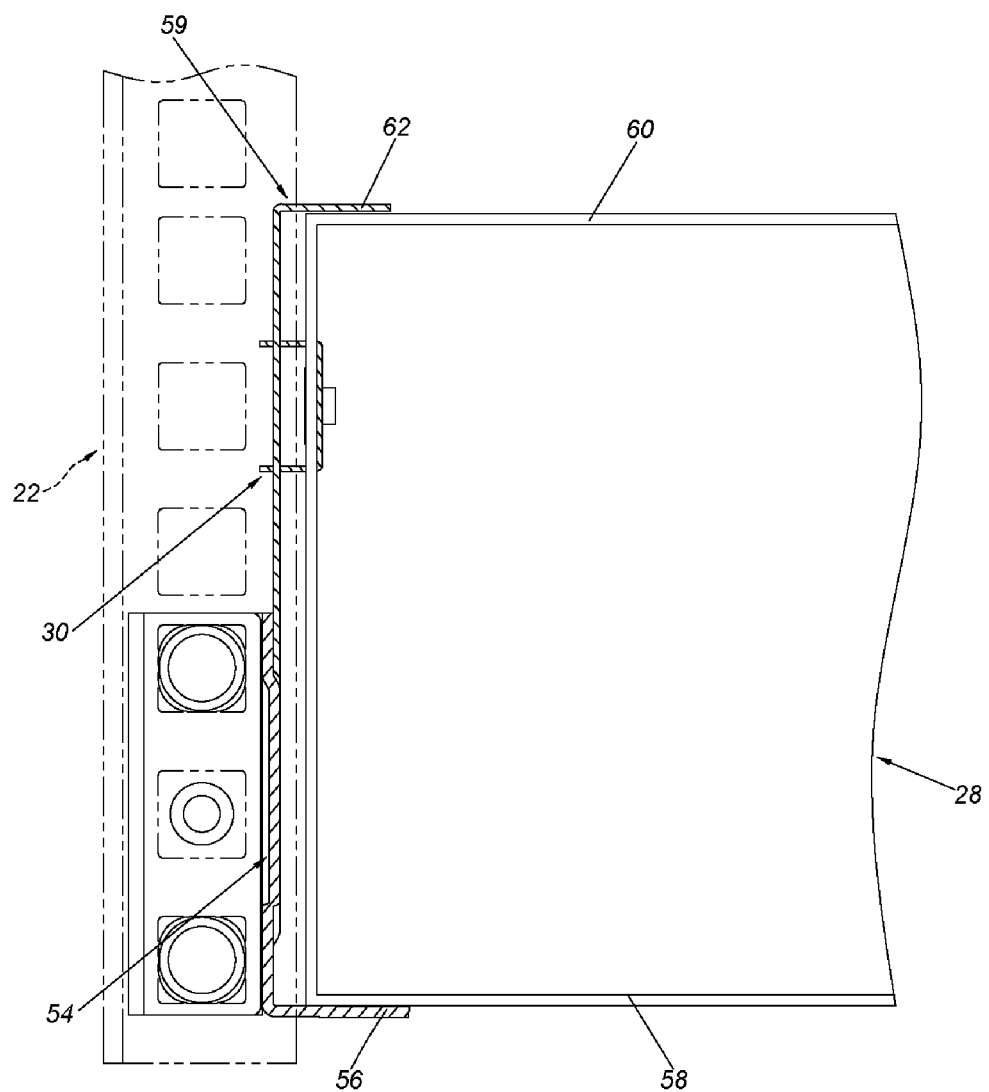
FIG. 11 is a front view of the rack system according to the embodiment of the present invention.

As shown in FIG. 11, the supporting rail 54 includes the horizon portion 56, which is able to support a bottom 58 of the carried object 28. On the other hand, the upper blocking member 59 is extended from the supporting rail 54 and has a bended portion 62. When the carried object 28 is located in a position (e.g., the first position P1), the bended portion 62 of the upper blocking member 59 is configured to obstruct a top side 60 of the carried object 28. The above-mentioned arrangement prevents the carried object 28 from being tilted upwards or downwards, so as to improve the reliability of arrangements of the carried object 28 on the first slide rail assembly 24 and on the second slide rail assembly 26. In addition, the above-mentioned arrangement respectively provides a bottom 58 and a top 60 of the carried object 28 with supporting and obstruction through the horizon portion 56 of the supporting rail 54 and the bended portion 62 of the blocking member 59. As a result, the embodiment of the present invention has no needs to dispose standoff(s) on the first side wall 34a of the carried object 28 and to disposed a running channel in cooperation with the standoff(s) on the supporting rail 54, so as to keep the integrity of the appearance of the carried object 28 and the structural strength of the supporting rail 54.

Compared to the prior art, the rack system has advantages over the prior art by the following perspectives:

1. The fastening member 30 is arranged on carried object 28. The first blocking portion 42 and the second blocking portion 44 of the fastening member 30 are able to cooperate respectively with the post of the rack, in order to prevent the carried object 28 from being moved from the second position P2 along the first direction D1, or in order to prevent the carried object 28 from being moved from the second position P2 along the second direction D2.

2. The supporting rail 54 includes the horizon portion 56, which is configured to support the bottom 58 of the carried object 28. On the other hand, the upper blocking member 59 provides the obstruction on the top 60 of the carried object 28.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rack system, comprising:
a rack comprising a plurality of posts;
a first slide rail assembly mounted on a first side of the rack;
a second slide rail assembly mounted on a second side of the rack;
a carried object arranged between the first slide rail assembly and the second slide rail assembly, the carried object comprising a first side wall and a second side wall, each of the first side wall and the second side wall having a front end portion and a rear end portion, wherein an engaging hole is arranged on at least one of the first side wall and the second side wall; and
a fastening member arranged on the carried object, the fastening member comprising a first blocking portion, a second blocking portion and an elastic arm, wherein an elastic force is applied to the first blocking portion and the second blocking portion through the elastic arm, the elastic arm has a fixing portion securely connected to the carried object, the first blocking portion extends out of the engaging hole on the carried object, a fastening portion is defined between the first blocking portion and the second blocking portion, the fastening portion is configured to be engaged with one of the plurality of posts of the rack;
wherein when the carried object is moved from a first position to a second position, a blocking section of the first blocking portion of the fastening member is located corresponding to one of the plurality of posts of the rack, in order to prevent the carried object from being moved from the second position toward the first position.

2. The rack system of claim 1, wherein the engaging hole on the carried object is located between the front end portion and the rear end portion, and the engaging hole is spaced from the front end portion by a distance.

3. The rack system of claim 1, wherein the first blocking portion of the fastening member has a guiding side, the guiding side is at least one of an inclined surface and an arc surface.

4. The rack system of claim 1, wherein the carried object has an operation hole, the operation hole is located corresponding to the elastic arm of the fastening member.

5. The rack system of claim 1, wherein the first blocking portion and the second blocking portion extend from an arm side of the elastic arm, an extended length of the second blocking portion is greater than a length of the first blocking portion.

6. The rack system of claim 1, wherein the first slide rail assembly and the second slide rail assembly are mounted on the rack through two brackets, respectively.

7. The rack system of claim 1, wherein one of the first slide rail assembly and the second slide rail assembly comprises an L-shaped supporting rail, the supporting rail is non-movable relative to the rack, the supporting rail is configured to support a bottom of the carried object.

8. The rack system of claim 7, further comprising an upper blocking member arranged on one of the first slide rail assembly and the second slide rail assembly, and the upper blocking member being configured to block a top of the carried object.

9. A carried object of a rack system, the rack system comprising a rack, the rack comprising a plurality of posts, the carried object comprising:
a first side wall and a second side wall, each of the first side wall and the second side wall having a front end portion and a rear end portion, wherein an engaging hole is arranged on at least one of the first side wall and the second side wall; and
a fastening member arranged at one of the first side wall and the second side wall, the fastening member comprising a first blocking portion, a second blocking portion and an elastic arm, wherein an elastic force is applied to the first blocking portion and the second blocking portion through the elastic arm, the elastic arm has a fixing portion, the fixing portion is securely connected to one of the first side wall and the second side wall of the carried object, the first blocking portion extends out of the engaging hole, a fastening portion is defined between the first blocking portion and the second blocking portion, the fastening portion is configured to be engaged with one of the plurality of posts of the rack;
wherein when the carried object is moved from a first position to a second position, a blocking section of the first blocking portion of the fastening member is located corresponding to a front side of one of the plurality of posts of the rack.

10. The carried object of the rack system of claim 9, wherein the engaging hole of the carried object is located between the front end portion and the rear end portion, and the engaging hole is spaced from the front end portion by a distance.

11. The carried object of the rack system of claim 9, wherein the first blocking portion of the fastening member has a guiding side, the guiding side is at least one of an inclined surface and an arc surface.

12. The carried object of the rack system of claim 9, wherein the carried object has an operation hole, the operation hole is located corresponding to the elastic arm of the fastening member.

13. The carried object of the rack system of claim 9, wherein the first blocking portion and the second blocking portion extend from an arm side of the elastic arm.

14. A rack system, comprising:
a rack comprising a plurality of posts;
a carried object mounted on the plurality of posts through a pair of slide rail assemblies; and
a fastening member arranged on the carried object, the fastening member comprising an elastic arm, a first blocking portion and a second blocking portion, wherein the first blocking portion and the second blocking portion are arranged on the elastic arm, a fastening portion is defined between the first blocking portion and the second blocking portion;
wherein the carried object has an operation hole, the operation hole is located corresponding to the elastic arm of the fastening member;
wherein when the carried object is moved from a first position to a second position along a first direction, the first blocking portion contacts one of the plurality posts of the rack, such that the elastic arm is deflected by an angle and accumulates an elastic force, and the first blocking portion is able to pass over one of the plurality of the posts of the rack;
wherein when the carried object is located in the second position, the fastening portion of the fastening member is configured to be engaged with one of the plurality of posts of the rack, the first blocking portion is able to be obstructed on a front side of one of the plurality of posts in response to the elastic force released from the elastic arm, so as to prevent the carried object from being moved from the second position along a second direction opposite to the first direction.

15. The rack system of claim 14, wherein the pair of slide rail assemblies are mounted on the plurality of posts of the rack through two brackets, respectively.

* * * * *